United States Patent [19]

Yano

[11] Patent Number: 5,177,692
[45] Date of Patent: Jan. 5, 1993

[54] METHOD AND APPARATUS FOR PROCESSING ERRORS OCCURRING UPON DIVISION OF PATTERN TO BE TRANSFERRED

[75] Inventor: Toshikazu Yano, Tokyo, Japan

[73] Assignee: Ando Electric Co., Ltd., Tokyo, Japan

[21] Appl. No.: 625,271

[22] Filed: Dec. 10, 1990

[30] Foreign Application Priority Data

Dec. 13, 1989 [JP] Japan .................................. 1-323268

[51] Int. Cl.⁵ ............................................. H01J 37/30
[52] U.S. Cl. .................................... 364/489; 364/488; 250/492.3
[58] Field of Search ................ 364/488, 489, 490, 491; 250/492.1, 492.2, 492.3

[56] References Cited

U.S. PATENT DOCUMENTS

| | | | |
|---|---|---|---|
| 4,812,962 | 3/1989 | Witt | 364/490 |
| 4,878,177 | 10/1989 | Ikenaga et al. | 364/490 |
| 4,950,910 | 8/1990 | Yasuda et al. | 364/490 |
| 5,086,398 | 2/1992 | Moriizumi | 364/490 |

OTHER PUBLICATIONS

"Electron-Beam Proximity Printing—A New High-Speed Lithography Method for Submicron Structures" by H. Bohlen et al., IBM J. Res. Develop., vol. 26, No. 5, Sep. 1982, pp. 568-579.

*Primary Examiner*—Vincent N. Trans
*Attorney, Agent, or Firm*—Seidel, Gonda, Lavorgna & Monaco

[57] ABSTRACT

In an apparatus for depicting a pattern with a beam of electrically charged particles, error making appearance upon division of a pattern into a plurality of subpatterns each of a size suited for irradiation with a predetermined resolution is suppressed by adding a first coordinate of one of the adjacent subpatterns which is deviated from the origin serving as a reference point by a given distance with a half value of the predetermined resolution to thereby produce a first sum value whose fractional part smaller than the resolution is rounded off to thereby obtain a first output value representing the origin, whereon the first output value is subtracted from the first coordinate to obtain a second output value which is then added to a length of a side of the one subpattern extending from the first coordinate in the diretion to which the first coordinate belongs to thereby obtain a second sum value. Finally, the second sum value and the half value of the resolution are added together to produce a third sum value whose fractional part smaller than the resolution is then rounded off, to obtain a second coordinate which delimits the side in cooperation with the first coordinate.

A series of first and second coordinates are used to create a plurality of lines. These lines are then used to divide the pattern into a series of corrected subpatterns.

3 Claims, 5 Drawing Sheets

METHOD AND APPARATUS FOR PROCESSING ERRORS OCCURRING UPON DIVISION OF PATTERN TO BE TRANSFERRED

BACKGROUND OF THE INVENTION

1. Field of the Invention

The present invention pertains to the technical field of drawing or depicting graphic patterns by using a beam of electrically charged particles. More specifically, the invention is concerned with a circuit for processing errors which occurs upon division or conversion of graphic or pattern data such as data of a mask into a plurality of blocks each of a size susceptible to transfer onto a semiconductor wafer, for example, through irradiation with a beam of electrically charged particles.

2. Description of the Related Art

The electrically charged particle beam type pattern depicting apparatus of concern is an apparatus which is adapted to depitc a pattern such as a circuit pattern on a semiconductor wafer directly by irradiating it with a beam of electrically charged particles (also referred to as the electrically charged particle beam). Frequently, the amount or size of graphic or pattern data inputted to the electrically charged particle beam type pattern depicting apparatus is too large to be transferred onto to a wafer at one time. Accordingly, when a graphic pattern of a large size is to be depicted through irradiation with the electrically charged particle beam, the data for that pattern is divided into a plurality of pattern portions or blocks (hereinafter also referred to as subpatterns) each of a size suited for exposure of the wafer.

FIG. 3 of the accompanying drawings shows an input pattern data in the state divided into a plurality of blocks or subpatterns. In the figure, a reference numeral 21 denotes generally the input graphic pattern, and 22 denotes individual subpatterns resulting from division of the input pattern. The input pattern 21 is shown in solid lines, while the subpatterns are shown in broken lines. For division of the input pattern in such a manner as shown in FIG. 3, calculation therefor is performed up to a fractional value which is less significant than a value which is required for minimizing error making appearance on the boundary, whereon the numerical value resulting from the calculation is finally rounded on or off so that resolution as desired can be obtained.

More specifically, referring to FIGS. 4 and 5 of the accompanying drawings, let's consider, for example, division along a boundary between the adjacent subpatterns 23 and 24 shown in FIG. 3.

In FIG. 4, distance or gap between adjacent vertical lines $X_n$ ($n=1, \ldots$) represents a desired minimum resolution $L_0$ of graphic data or pattern. When the coordinates and lengths of sides of the subpattern 23 resulting from the division contain errors smaller than the minimum resolution $L_0$, mere rounding-up or -off of the values representing the coordinates and the lengths such that the data may conform to the necessary minimum resolution $L_0$ will bring about gaps or overlaps between the adjacent subpatterns 23 and 24.

For convenience of explanation, only the X-coordinate data in the example illustrated in FIG. 4 will be considered. Let's represent the X-coordinate of a starting point of the subpattern 23 by $X_{11}$, while representing error smaller than the minimun resolution $L_0$ contained in the data of the X-coordinate $X_{11}$ by $L_1$, the length of a bottom side by $L_2$, the X-coordinate of an end point of the subpattern by $X_{12}$, the X-coordinate of a starting point of the subpattern 24 by $X_{12}$, and represent by $L_3$ the error contained in data of the X-coordinate $X_{12}$ which error is smaller than the minimum resolution $L_0$, respectively. Further, it is assumed that $L_1 < L_0/2$, $L_3 \geq L_0/2$ and that $L_3 - L_1 < L_0$.

On the conditions mentioned above, the rounding-up/off processing will result in that the error $L_1$ of the X-coordinate $X_{11}$ of the starting point of the subpattern 23 is rounded off, as a result of which the position of the starting point of the subpattern 23 is displaced to the coordinate $X_1$, as shown at (c) in FIG. 4. Consequently, when the length of the bottom side of the subpattern 23 is considered, starting from the new coordinate $X_1$, the X-coordinate $X_{12}$ of the end point of that side is displaced by $L_1$ to the coordinate $X_{13}$, as shown at (c) in FIG. 4. The error in the length of the side given by $(L_3 - L_1)$ is smaller than $L_0/2$ and thus rounded off. As a result, the end point X-coordinate $X_{12}$ of the subpattern 23 is ultimately shifted to the coordinate $X_4$, as can be seen in FIG. 4 at (d).

On the other hand, the X-coordinate $X_{12}$ of the starting point of the subpattern 24 is rounded up because the error $L_3$ has a value greater than $L_0/2$, inclusive thereof, and is thus displaced to the coordinate $X_5$, as shown in FIG. 4 at (e). Consequently, there makes appearance a gap between the subpattern 23 and 24, as shown in FIG. 4 at (e) as well.

Now, it is assumed that $L_1 \geq L_0/2$, $L_3 < L_0/2$ and that $(L_0 - L_1) + L_3 \geq L_0/2$. In this case, the rounding-up/off processing results in that error $L_1$ of the starting point X-coordinate of the subpattern 23 is rounded up to be displaced to the coordinate $X_2$, as shown at (c) in FIG. 5. Accordingly, when the length of the bottom side is considered, starting from the new starting point X-coordinate $X_2$, the X-coordinate $X_{12}$ of the end point of the subpattern 23 is increased by $(L_0 - L_1)$ to be displaced to the coordinate $X_{13}$. Since the error in the length of the side given by $(L_3 + L_0 - L_1)$ is greater than $L_0/2$, inclusive thereof, the error is rounded up. Consequently, the end point X-coordinate $X_{13}$ of the subpattern 23 is displaced to $X_5$, as shown at (d) in FIG. 5. On the other hand, the X-coordinate $X_{12}$ of the starting point of the pattern 24 is displaced to the X-coordinate $X_4$, as shown at (e) in FIG. 5, because the error $L_3$ is equal to $L_0/2$ and thus rounded up. As the ultimate result, there makes appearance overlap between the adjacent subpatterns 23 and 24, as shown in FIG. 5 at (e).

As will be understood from the above, the rounding-up/off processing results in that a gap equivalent to the minimum resolution $L_0$ makes appearance between the adjacent subpatterns 23 and 24 in the case of the example illustrated in FIG. 4. On the other hand, in the case of the example shown in FIG. 5, an overlap corresponding to the minimum resolution $L_0$ takes place between the subpatterns 23 and 24.

Needles to say, such gap and overlap which may make appearance upon division of the input graphic data, as described above, bring about concave portions or dents and convex portions or projections in the periphery of a pattern resulting from the depiction with the electrically charged particle beam, because the pattern is extremely fine, as exemplified by the fact that the pattern line is on the order of submicrons. Thus, there exists a great demand for eliminating the gap and/or overlap between adjacent subpatterns resulting from division of a graphic pattern to be imprinted.

Although the above description has been directed to the errors in the X-direction, it is self-explanatory that similar errors may occur in the Y-direction as well.

SUMMARY OF THE INVENTION

Accordingly, a primary object of the present invention is to provide a method for eliminating gaps and/or overlaps which may make appearance between adjacent subpatterns resulting from division of a graphic pattern to be imprinted into a plurality of subpatterns each of a size capable of being depicted with a charged particle beam type pattern depicting apparatus in which individual graphic data for the pattern division are rounded up/off in conformance with a minimum resolution of a beam deflecting system of the apparatus.

It is another object of the present invention to provide an arithmetic operation circuit for carrying out the method mentioned above.

It is another object of the present invention to provide an pattern depicting apparatus of electroically charged particle beam type which is capable of depicting a large size pattern by dividing it into a plurality of subpatterns without suffering from such errors as mentioned above.

In view of above and other objects which will become more apparent as description proceeds, it is proposed according to an aspect of the present invention that in an apparatus for depicting a pattern with a beam of electrically charged particles, a method of suppressing error making appearance upon division of a pattern into a plurality of subpatterns with a predetermined resolution, which method comprises a first step of adding together a first coordinate of one of the adjacent subpatterns which is deviated from the origin serving as a reference point by a given distance and a half value of the predetermined resolution to thereby produce a first sum value whose fractional part smaller than the resolution is rounded off to obtain a first output value representing the origin, a second step of subtracting the first output value from the first coordinate to obtain a second output value, a third step of adding together the second output value and a length of a side of the one subpattern extending from the first coordinate in the direction to which the first coordinate belongs, to thereby obtain a second sum value, and a fourth step of adding together the second sum value and the half value of the resolution to produce a third sum value whose fractional part smaller than the resolution is rounded off, to thereby obtain a second coordinate delimiting the side in cooperation with the first coordinate.

According to another aspect of the invention, there is provided an arithmetic operation circuit for carrying out the method mentioned above as well as a pattern depicting apparatus of electrically charged particle beam type which incorporates therein the operation circuit.

BRIEF DESCRIPTION OF THE DRAWINGS

The invention will become more readily apparent from the following description of preferred embodiments thereof shown, by way of example only, in the accompanying drawings, in which.

DETAILED DESCRIPTION OF THE PREFERRED EMBODIMENTS

Figure 1:
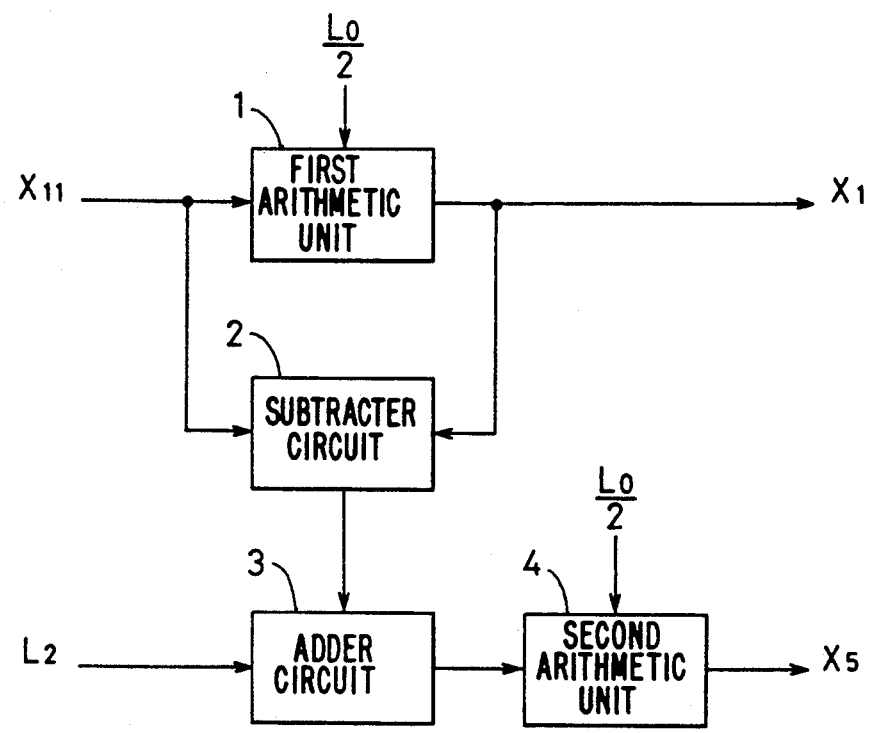
FIG. 1 is a block diagram showing schematically a general arrangement of an error processing circuit for a charged particle beam pattern depicting apparatus according to an exemplary embodiment of the invention.
Figure 3:
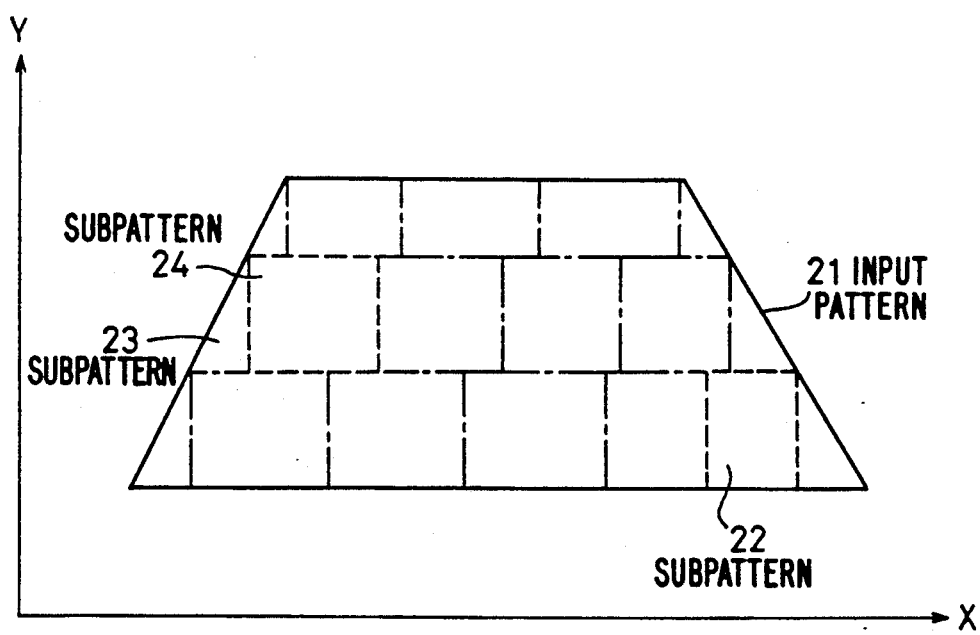
FIG. 3 is a diagram for illustrating a manner in which a pattern to be depicted with a beam of electrically charged particles in divided into a plurality of subpatterns each of a size suited for the depiction.
Figure 2:
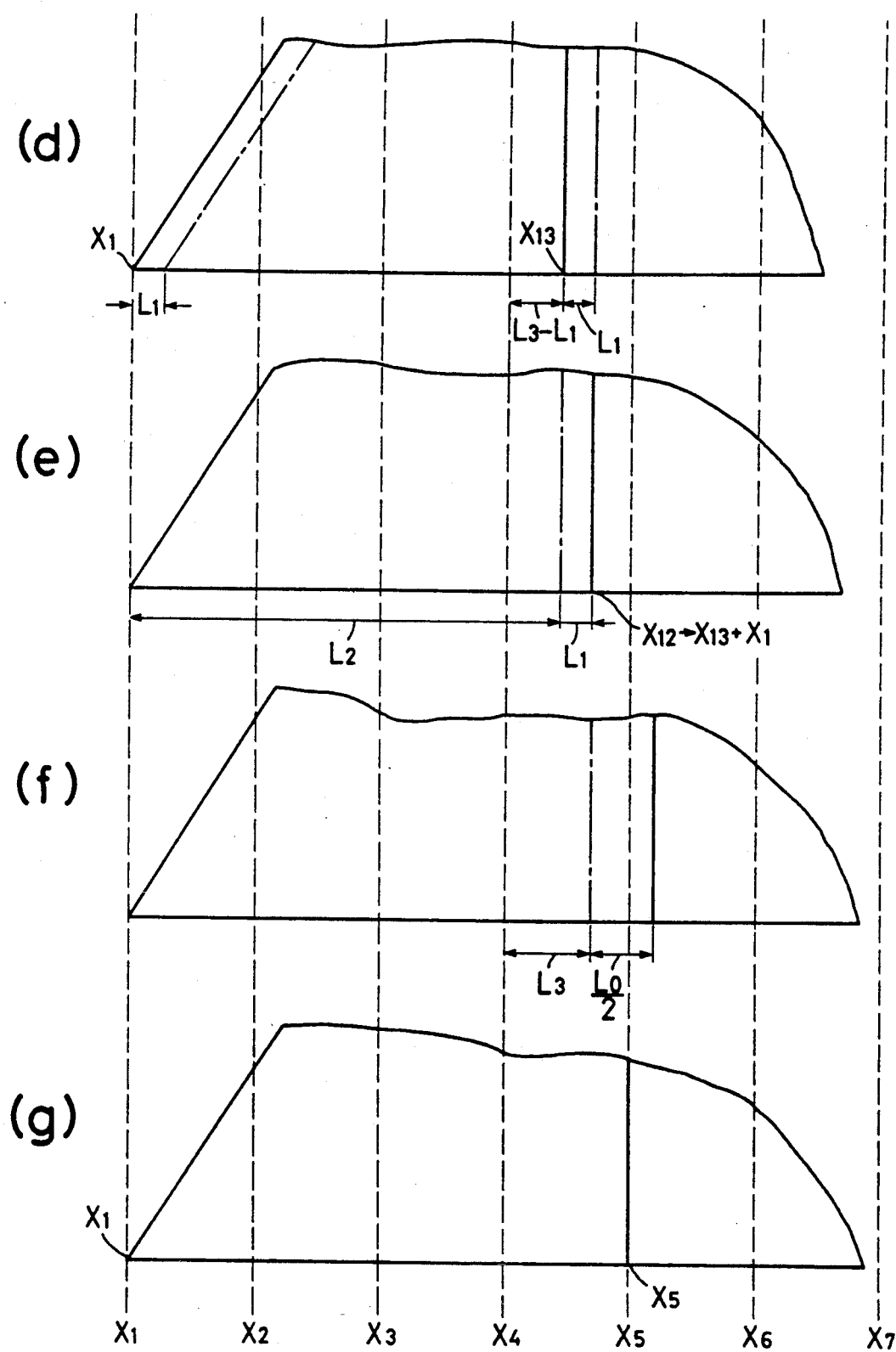
FIG. 2 is a diagram for illustrating operations of the circuit shown in FIG. 1.
Figure 2:
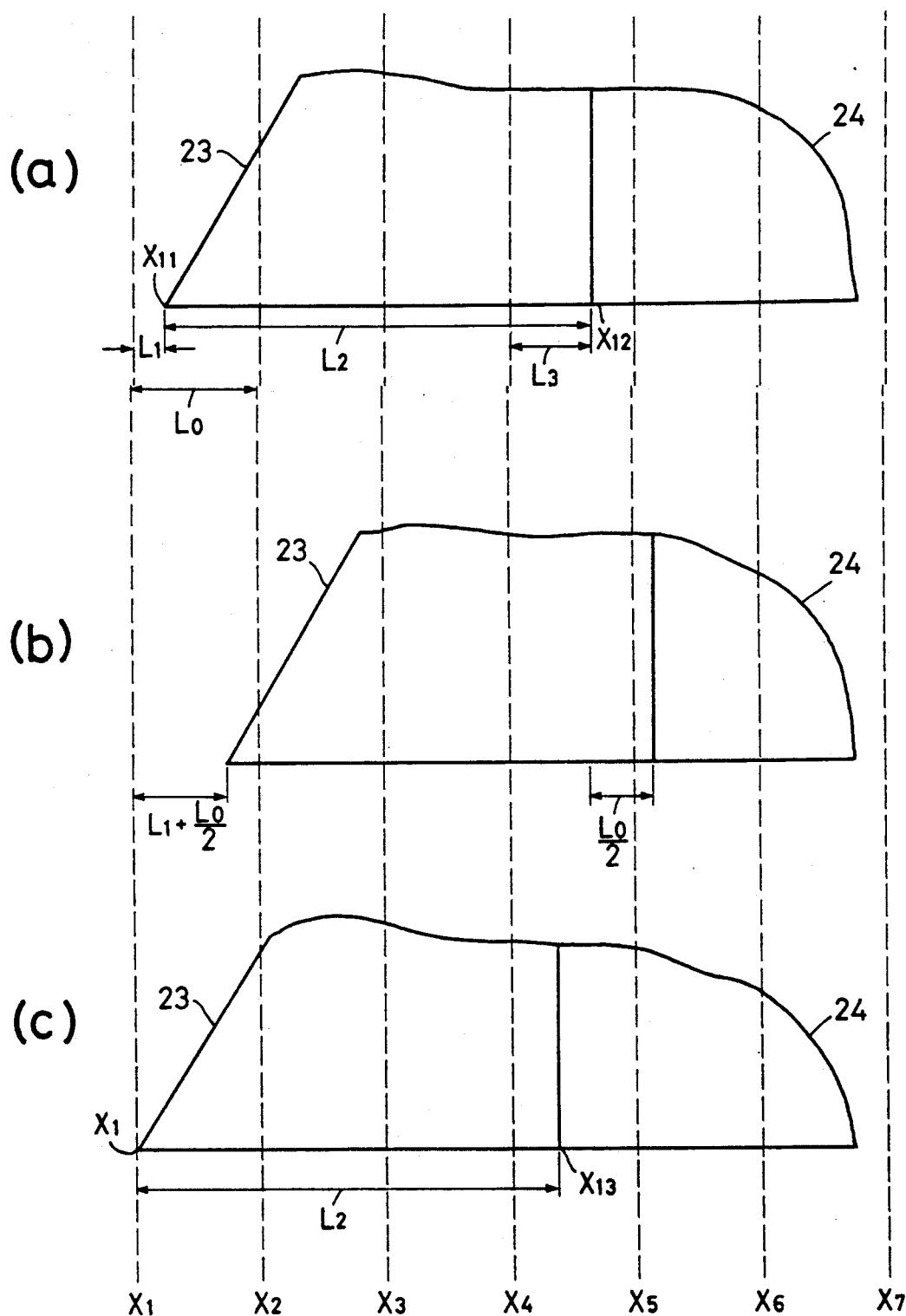
Figure 4:
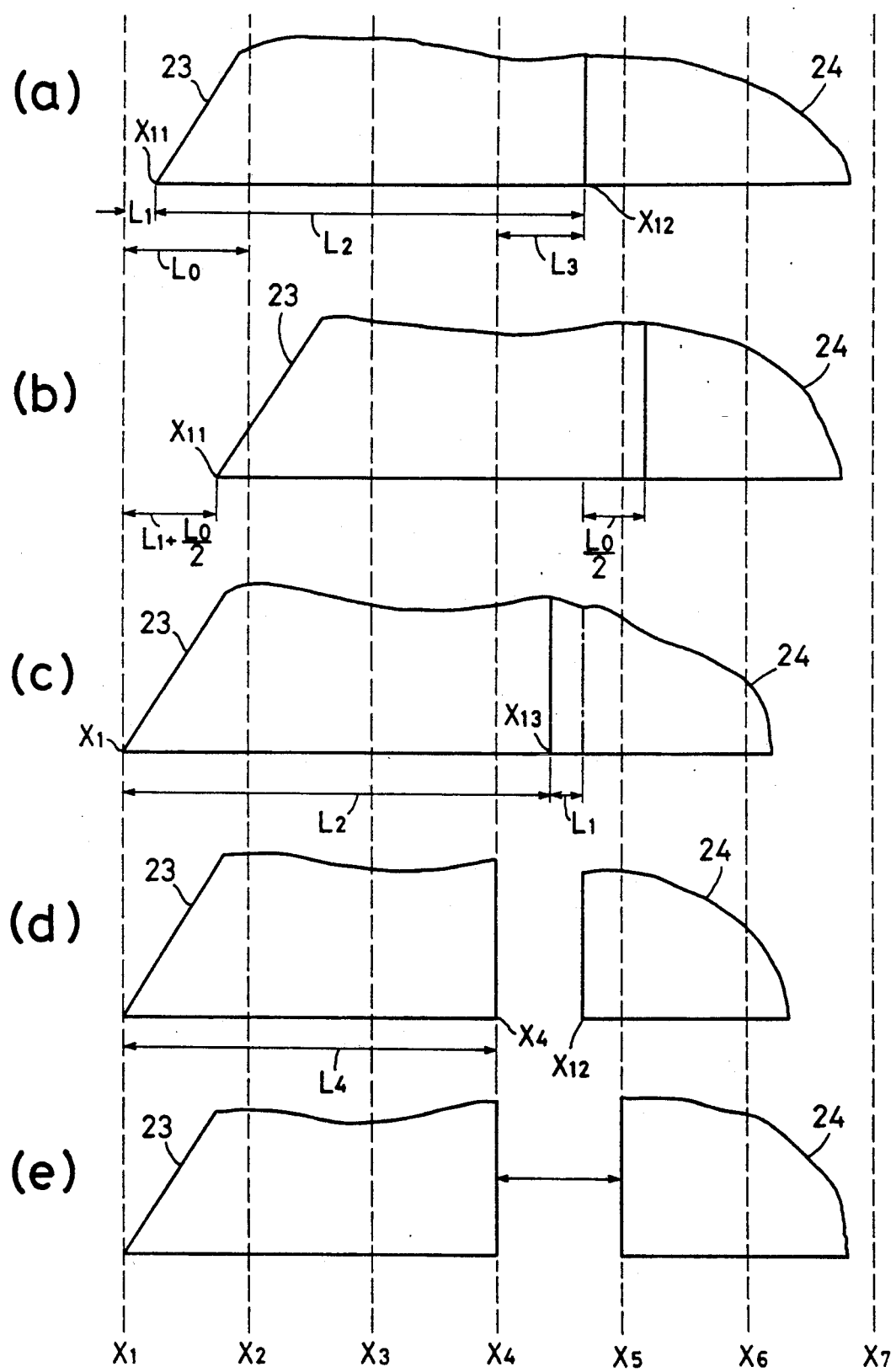
FIGS. 4 and 5 are diagrams for illustrating occurrence of errors such as gaps and/or overlaps between adjacent subpatterns resulting from the pattern division processing.
Figure 5:
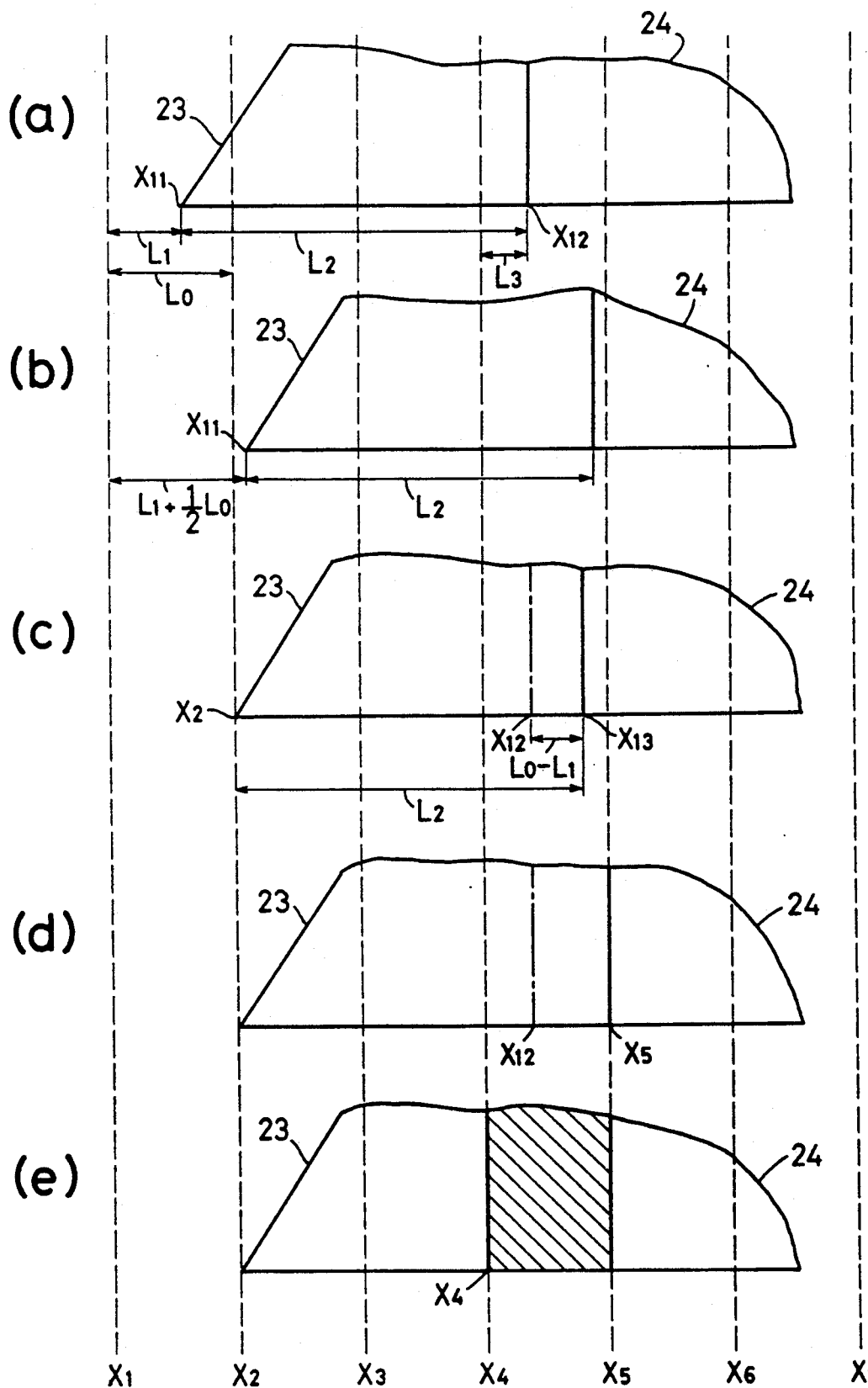

Now, the present invention will be described in detail in conjution with an exemplary or preferred embodiment thereof by reference to FIGS. 1 and 2, in which FIG. 1 shows schematically a structure of the error processing circuit according to the invention and FIG. 2 is a view for illustrating operation of the circuit. In the description which follows, it is assumed that division of a pattern into a plurality of subpatterns each of a size suited for depiction is performed in the same manner as illustrated in FIG. 3 and that the symbols used in FIGS. 1 and 2 such as L, X and others have the same meanings as those defined hereinbefore in conjution with FIGS. 4 and 5.

In FIG. 1, reference numeral 1 denotes a first arithmetic unit, 2 denotes a subtracter circuit, 3 denotes and adder circuit and 4 denotes a second arithmetic unit, respectively.

Referring to FIG. 1 in combination with FIG. 2, the X-coordinate $X_{11}$ of a point of the pattern 23 which is offset from the origin $X_1$ by a distance (error) $L_1$ is inputted to the first arithmetic unit 1 which then adds the input X-coordinate $X_{11}$ with a half of the minimum resolution $L_0$ of a beam deflecting system of a pattern depicting apparatus as employed and rounds off the fractional part of the sum to thereby output a signal representing the origin $X_1$.

The coordinate $X_{11}$ is inputted to the subtracter 2 as well, which subtracts the output of the arithmetic unit 1 from the coordinate $X_{11}$.

The adder 3 adds together the output of the subtracter 2 and the side length $L_2$ to output a sum thereof.

The second arithmetic unit 4 adds together the sum outputted from the adder 3 and a half of the minimum resolution $L_0$ and rounds off a numerical value or fraction of the sum which is smaller than the minimum resolution $L_0$.

The circuit shown in FIG. 1 is destined for the arithmetic processing of the X-coordinate data. It should be understood that a similar circuit arrangement is additionally required for processing the Y-coordinate data in the similar manner.

Now referring to FIG. 2, the starting point coordinate data value $X_{11}$ of the subpattern 23 is added with $L_0/2$ by the arithmetic unit 1 and the fraction thereof which is smaller than the minimum resolution $L_0$ is rounded off, whereby the corrected starting point coordinate data $X_1$ is outputted, as shown at (c) in FIG. 2.

The subtracter 2 determines difference between the corrected starting point data $X_1$ and the starting point data $X_{11}$ before the correction. The difference is added with the side length $L_2$ of the subpattern 23 by the adder 3.

By adding to the side length $L_2$ the error $L_1$ of the starting point coordinate data of the subpattern 23, the X-coordinate of the end point of the side of the subpattern 23 undergoes no change by the rounding of the coordinate data and remains at a position $X_{12}$, as shown in FIG. 2 at (a).

Next, the arithmetic unit 4 adds $L_0/2$ to the end point coordinate $X_{12}$ and rounds off the fraction smaller than the minimum resolution $L_0$, as is in the case of the arithmetic unit 1.

The side length error remains as $L_3$. Thus, the end point X-coordinate of the subpattern 23 and the starting point X-coordinate of the subpattern 24 are both located at $X_{13}$, bringing about no gap.

Through the procedure described above, the end point X-coordinate $X_{13}$ of the subpattern 23 shown in FIG. 2 can be obtained.

As will now be appreciated from the foregoing description, when the graphic subpatterns resulting from division of a pattern to be depicted are so processed as to be rounded to a finally required minimum resolution, error making appearance at the starting point of the subpattern data is once corrected, whereon the corrected data is added to the side length data of the graphic pattern with the end point coordinate being rounded. In this way, appearance of gap and/or overlap between the adjacent subpatterns upon division of a pattern to be detected can be suppressed satisfactorily.

It is thought that the present invention and many of its attendant advantages will be understood from the foregoing description and it will be apparent that various changes may be made in the form, construction and arrangement thereof without departing from the spirit and scope of the invention or sacrificing all of its material advantages, the form hereinbefore described being merely a preferred or exemplary embodiment thereof.

What is claimed is:

1. In an apparatus for depicting a pattern with a beam of electrically charged particles,
   a method of suppressing error making appearance upon division of a pattern into a plurality of subpatterns with a predetermined resolution, comprising:
   a first step of adding together a first coordinate of one of the adjacent subpatterns which is deviated from the original serving as a reference point by a given distance and a half value of said predetermined resolution to thereby produce a first sum value whose fractional part smaller than said resolution is rounded off to obtain a first output value representing said origin;
   a second step of subtracting said first output value from said first coordinate to obtain a second output value;
   a third step of adding together said second output value and a length of a side of said one subpattern extending from said first coordinate in the direction to which the first coordinate belongs, to thereby obtain a second sum value;
   a fourth step of adding together said second sum value and the half value of said resolution to produce a third sum value whose fractional part smaller than said resolution is rounded off, to thereby obtain a second coordinate delimiting said side in cooperation with said first coordinate;
   a fifth step of using said first coordinate and said second coordinate to define at least one line; and
   a sixth step of depicting onto a substrate said corrected subpatterns based upon said at least one line.

2. In an apparatus for depicting a pattern with a beam of electrically charged particles,
   a circuit for suppressing error making appearance upon division of a pattern into a plurality of subpatterns with predetermined resolution, comprising:
   a first arithmetic unit for adding together a first coordinate of one of the adjacent subpatterns which is deviated from the origin serving as a reference point by a given distance and a half value of said predetermined resolution to thereby produce a first sum value whose fractional part smaller than said resolution is rounded off to obtain a first output value representing said origin;
   a subtracter for subtracting said first output value from said first coordinate to obtain a second output value;
   an adder for adding together said second output value and a length of a side of said one subpattern extending from said first coordinate in the direction to which first coordinate belongs, to thereby obtain a second sum value; and
   a second arithmetic unit for adding together said second sum value and the half value of said resolution to produce a third sum value whose fractional part smaller than said resolution is rounded off, to thereby obtain a second coordinate delimiting said side in cooperation with said first coordinate;
   means for using an electrically charged particle beam type pattern depicting apparatus to depict onto a substrate corrected subpatterns based upon at least one line defined by said first and second coordinates.

3. An apparatus for depicting a pattern with a beam of electrically charged particles, comprising means for dividing a pattern into a plurality of subpatterns each of a size suited for transfer through irradiation with said beam with a predetermined resolution, and a circuit for suppressing errors making appearance upon division of said pattern,
   said circuit comprising:
   a first arithmetic unit for adding together a first coordinate of one of the adjacent subpatterns which is deviated from the origin serving as a reference point by a given distance and a half value of said predetermined resolution to thereby produce a first sum value whose fractional part smaller than said resolution is rounded off to obtain a first output value representing said origin;
   a subtracter for subtracting said first output value from said first coordinate to obtain a second output value;
   an adder for adding together said second output value and a length of a side of said one subpattern extending from said first coordinate in the direction to which first coordinate belongs, to thereby obtain a second sum value; and
   a second arithmetic unit for adding together said second sum value and the half value of said resolution to produce a third sum value whose fractional part smaller than said resolution is rounded off, to thereby obtain a second coordinate delimiting said side in cooperation with said first coordinate;
   wherein said means for dividing uses said first and second coordinates to make the division of said pattern.

* * * * *